(12) United States Patent
Engl

(10) Patent No.: US 6,580,381 B2
(45) Date of Patent: Jun. 17, 2003

(54) ANALOG-TO-DIGITAL CONVERTER WITH COMPLEMENTARY TRANSISTORS

(75) Inventor: Bernhard Engl, Miesbach (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/943,537

(22) Filed: Aug. 30, 2001

(65) Prior Publication Data

US 2002/0067298 A1 Jun. 6, 2002

(30) Foreign Application Priority Data

Aug. 30, 2000 (DE) .......................... 100 42 584

(51) Int. Cl.[7] .............................................. H03M 1/00
(52) U.S. Cl. ........................................ 341/136; 341/159
(58) Field of Search ................................ 341/136, 159, 341/155, 143, 160

(56) References Cited

U.S. PATENT DOCUMENTS

| 4,752,766 A | | 6/1988 | Shimizu et al. ............. 341/159 |
| 5,416,484 A | * | 5/1995 | Lofstrom ..................... 341/159 |
| 5,774,086 A | * | 6/1998 | Guyot ......................... 341/159 |
| 6,204,794 B1 | * | 3/2001 | Bult ............................ 341/155 |

* cited by examiner

Primary Examiner—Peguy JeanPierre
Assistant Examiner—Joseph J Lauture
(74) Attorney, Agent, or Firm—Laurence A. Greenberg; Werner H. Stemer; Ralph E. Locher

(57) ABSTRACT

Located between the frustoconical needle tip and the cylindrical needle shank of a nozzle needle of a fuel injection valve is a frustoconical needle portion, into which is introduced a peripheral groove, by means of which damping is capable of being set, depending on the position of the groove, during the axial movement of the nozzle needle.

28 Claims, 9 Drawing Sheets

ANALOG-TO-DIGITAL CONVERTER WITH COMPLEMENTARY TRANSISTORS

BACKGROUND OF THE INVENTION

1. Field of the Invention

The present invention relates to analog-to-digital converters having a first reference potential source for providing first reference potentials, a first input stage having at least two differential amplifiers. Each of the differential amplifiers have a first and second transistor, a first input for feeding in one of the reference potentials, a second input for feeding in a first input signal, and two output terminals.

2. Description of the Related Art

An analog-to-digital converter (A/D converter) of this type is disclosed for example in Hui Pan et al.: "A3.3V 12b 50Msample/s A/D Converter in 0.6 µm CMOS with over 80 dB SFDR", paper MP 2.4, Proceedings of the International Solid State Circuit Conference ISSCC 2000. FIG. 1 illustrates an input stage of such an A/D converter according to the prior art.

This A/D converter has as reference potential source, a series circuit of resistors R11, R12, R13, R14, R15 which are connected up between a supply potential Vdd and a reference-ground potential GND. In this case, different reference potentials VRP1, VRP2, VRP3, VRP4 can be tapped off in each case at nodes between two adjacent resistors. These reference potentials VRP1, VRP2, VRP3, VRP4 are fed to respective first inputs of identically constructed differential amplifiers DV11, DV12, DV13, DV14, a first input signal VIP being fed to second inputs of these differential amplifiers DV11, . . . , DV14. The differential amplifiers DV11, . . . , DV14 each have first and second transistors T11, T12, the gate terminal of the first transistor T11 being connected to a first input terminal E11 of the differential amplifier and the gate terminal of the second transistor T12 being connected to a second input terminal E12. Source terminals of the first and second transistors of the differential amplifier DV11, . . . , DV14 are connected to a common current source I11. The drain terminals of the first and second transistors T11, T12 form output terminals A11, A12 of the differential amplifiers DV11, . . . , DV14, these output terminals A11, A12 being connected to a second supply potential V+ via resistors RL1, RL2, for example. By means of comparators (not specifically illustrated), the potentials at the two output terminals A11, A12 of a differential amplifier are evaluated, and the first input signal VIP is compared with all the reference potentials VRP1, . . . , VRP4 in this way.

The A/D converter known according to the prior art and illustrated in FIG. 1 has a second input stage in addition to the first input stage. This second input stage has a series circuit of resistors R21, R22, R23, R24, which are connected up between the supply potential Vdd and the reference-ground potential GND. In this case, reference potentials VRM1, VRM2, VRM3, VRM4 can be tapped off at nodes between the resistors R21, . . . , R24 and are fed to respective first inputs of differential amplifiers DV21, DV22, DV23, DV24. These differential amplifiers DV21, . . . , DV24 are identical to one another and identical to the differential amplifiers DV11, . . . , DV14 of the first input stage. A second input signal VIM, which corresponds to the difference between a constant signal and the input signal VIP, is fed to the second input terminal of the differential amplifiers DV21, . . . , DV24 of the second input stage. A differential amplifier of the first input stage and a differential amplifier of the second input stage in each case form a differential amplifier pair, in which the first output A11 of a differential amplifier DV11 of the first input stage is connected to the second output A22 of a differential amplifier DV21 of the second input stage and a second output A12 of a differential amplifier DV11 of the first input stage is connected to a first output A21 of a differential amplifier DV21 of the second input stage. In this case, the common outputs M1, P1 are connected to the second supply potential V+ via resistors RL1, RL2. The reference potentials VRM1, . . . , VRM4 fed to the differential amplifiers DV21, . . . , DV24 of the second input stage correspond to the difference between the first supply potential Vdd and the supply potential VRP1, VRP2, VRP3, VRP4 of the associated differential amplifier DV11, . . . , DV14 of the first input stage. This combination of two differential amplifiers to form a differential amplifier pair, complementary input signals VIP, VIM and complementary reference potentials VRP1, . . . , VRP4, VRM1, . . . , VRM4 in each case being fed to the individual differential amplifiers of a differential amplifier pair, increases the common-mode rejection of such an A/D converter according to the prior art.

In order to be able to operate the transistors of the differential amplifiers in the known A/D converter in the saturation region, a minimum gate potential is required for driving them, which results from the sum of the saturation voltage of the current source, the threshold voltage, that is to say the gate-source voltage at which the transistors start to conduct, and an effective gate voltage. When the transistors are realized as n-channel MOS transistors and the current sources are also realized as MOS transistors using silicon technology, typical values are 0.15 V for the saturation voltage of the current source, 0.3 V for the threshold voltage and 0.15 V for the required effective gate voltage, with the result that the gate potential at the transistors must be a minimum of 0.6 V in order to be able to operate the transistors of the differential amplifiers in the saturation region. In other words, the respective smallest reference potential (VRP1, VRM4 in FIG. 1) must be at least 0.6 V. If a supply voltage of 1.2 V is assumed for an entire circuit arrangement in which the A/D converter is realized, and if account is taken of the fact that driver stages for providing the input voltage VIP, VIM usually fall short by at least 0.2 V in attaining the supply voltage of 1.2 V, with the result that the maximum input voltage is only about 1.0 V, then a usable input voltage range remains within which the input signal VIP is permitted to fluctuate by only 0.4 V, which corresponds to one third of the supply voltage. Such a small input voltage range is not sufficient for many applications.

SUMMARY OF THE INVENTION

It is an aim of the present invention, therefore, to provide an analog-to-digital converter in which the processable voltage range of the input signal is increased compared with previously known analog-to-digital converters.

This aim is achieved with an A/D converter wherein first and second transistors of at least one of the differential amplifiers are of a type complementary to the first and second transistors of the other differential amplifiers.

Accordingly, the A/D converter according to the invention has a first reference potential source for providing first reference potentials, and a first input stage having at least two differential amplifiers, which each have a first and a second transistor. According to the invention, the first and second transistors of at least one differential amplifier are of a type complementary to the first and second transistors of the other differential amplifiers, in other words the first and second transistors of at least one differential amplifier are designed as p-channel transistors, while the first and second transistors of the other differential amplifiers are designed as n-channel transistors.

The advantage of using differential amplifiers having p-channel transistors and differential amplifiers having n-channel transistors in an A/D converter consists in the possibility of also being able to process input signals which lie below the minimum gate potential for n-channel transistors.

BRIEF DESCRIPTION OF THE DRAWINGS

The present invention is explained in more detail below using exemplary embodiments with reference to figures, in which.

DESCRIPTION OF THE PREFERRED EMBODIMENTS

In the figures, unless specified otherwise, identical reference symbols designate identical parts with the same meaning.

Figure 1:
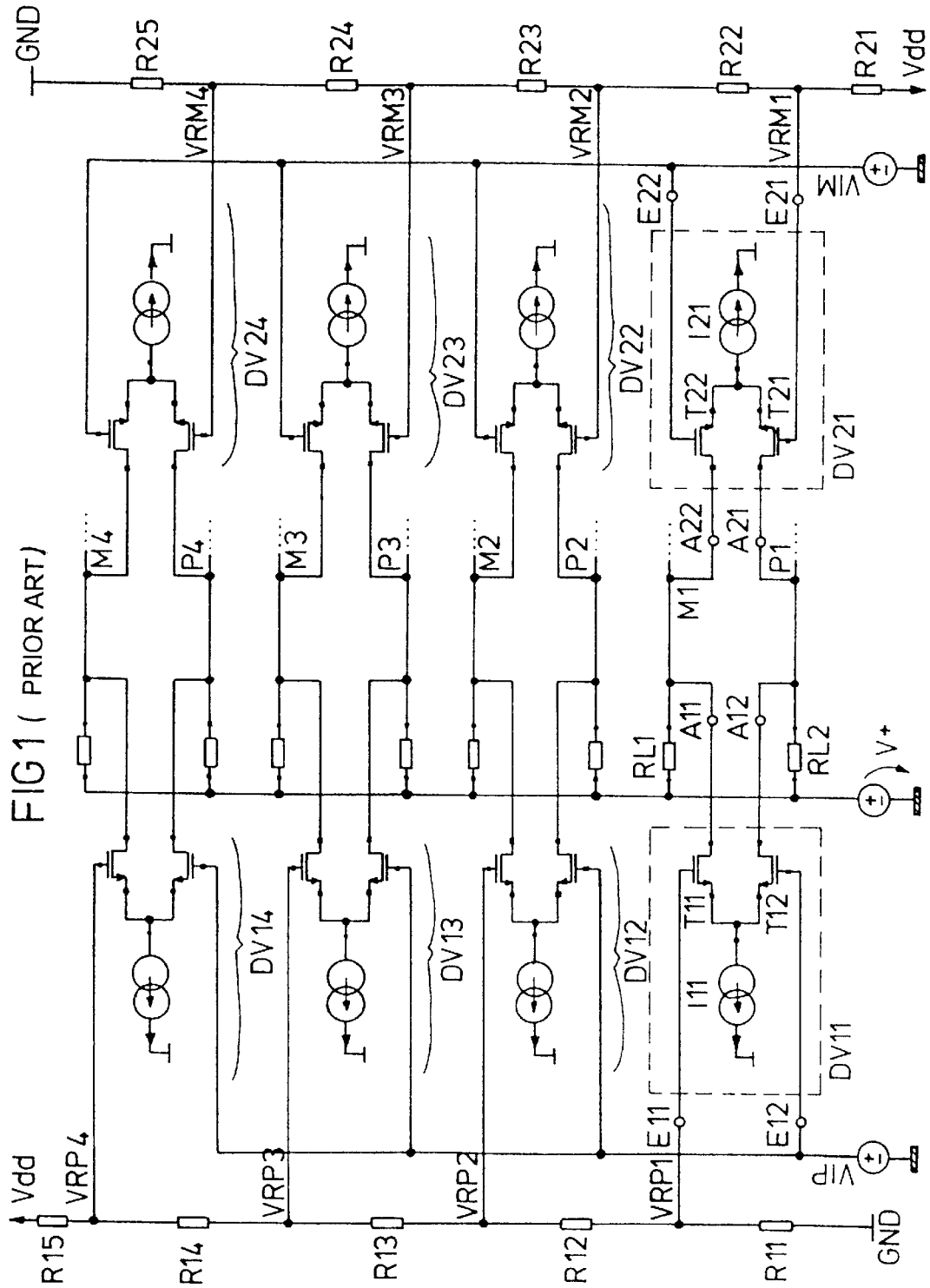
FIG. 1 shows an A/D converter according to the prior art.
Figure 2:
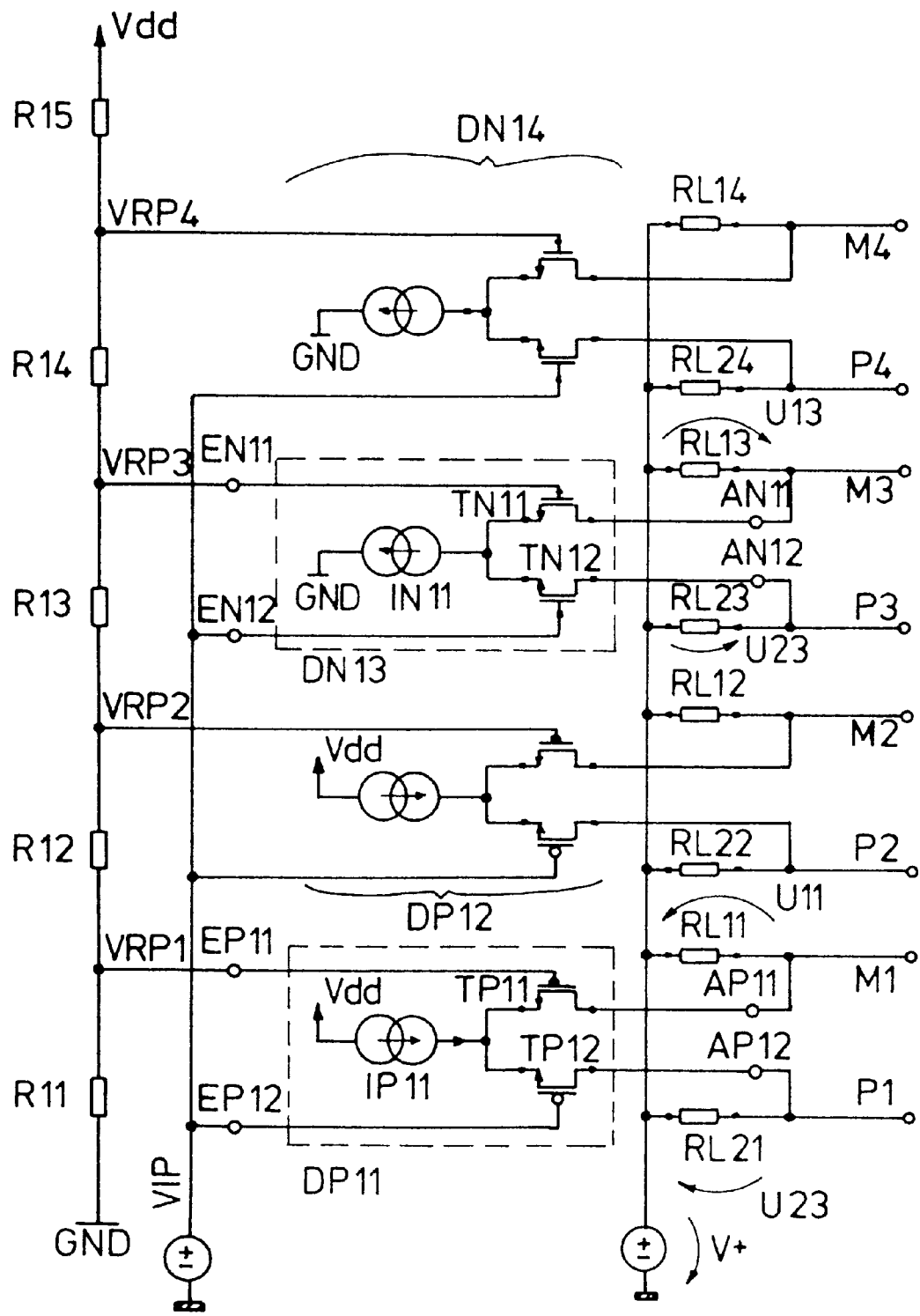
FIG. 2 shows an A/D converter according to the invention in accordance with a first embodiment with a first input stage.

FIG. 2 shows an A/D converter in accordance with a first embodiment of the invention. The A/D converter has a first reference current source comprising a series circuit of resistors R11, R12, R13, R14, R15 between a supply potential Vdd and a reference-ground potential GND and differential amplifiers DP11, DP12, DN13, DN14 for comparing reference potentials VRP1, VRP2, VRP3, VRP4 with an input signal VIP. The resistors R11, R12, R13, R14, R15 preferably have the same value, with the result that the reference potentials VRP1, VRP2, VRP3, VRP4, which can each be tapped off at nodes between two adjacent resistors, in each case differ by multiples of the smallest reference potential VRP1. FIG. 2 shows, by way of example, a 2-bit converter having four differential amplifiers in order to be able to compare the input signal VIP with four different reference potentials VRP1, . . . , VRP4. The resolution of the A/D converter increases with the number of differential amplifiers, and so an 8-bit converter requires 256 differential amplifiers and a reference potential source which provides a corresponding number of reference potentials. Such a reference potential source can be realized in a simple manner by connecting a correspondingly large number of resistors in series between the supply potential and the reference-ground potential.

The differential amplifiers DP11, DP12, DN13, DN14 of the A/D converter according to the invention each have first transistors TP11, TN11 and second transistors TP12, TN12, the source terminals of the two transistors TP11, TP12; TN11, TN12 of a differential amplifier DP11, DN13 being jointly connected to a current source IP11, IN11. For reasons of clarity, reference symbols for the components of the differential amplifiers are depicted only for the components of the differential amplifiers DP11, DN13.

The construction of the differential amplifier DP11, which is connected to the lowest reference potential VRP1, is identical to the construction of the differential amplifier DP12, which is connected to the second lowest reference potential VRP2. The first and second transistors TP11, TP12 of these differential amplifiers DP11, DP12 are designed as p-channel transistors. In this case, the gate terminals of the first transistors TP11 are connected to the respective reference potential VRP1, VRP2 via first input terminals EP11 of the differential amplifiers DP11, DP12, and the gate terminals of the second transistors TP12 are connected to the first input signal VIP via second input terminals EP12 of the differential amplifiers DP11, DP12. The source terminals of the first and second transistors TP11, TP12 of the differential amplifiers DP11, DP12 are in each case connected to a common current source IP11, whose other terminal is connected to supply potential Vdd. The drain terminals of the first transistors TP11 form output terminals AP11 and the drain terminals of the second transistors TP12 form second output terminals AP12 of the differential amplifiers DP11, DP12. These output terminals are connected to a second supply potential V+ via load resistors RL11, RL21, RL12, RL22 in the exemplary embodiment in accordance with FIG. 2.

The potentials at the output terminals AP11, AP12 are fed to inputs M1, P1, M2, P2 of comparators (not specifically illustrated), the comparators evaluating these potentials, which are dependent on the ratio of the input signal VIP and of the respective reference signal VRP1, VRP2 of the differential amplifiers DP11, DP12.

The construction of the differential amplifiers DN13, DN14 connected to the two highest reference potentials VRP3, VRP4 corresponds to that of the differential amplifiers DP11, DP12, n-channel MOS transistors being used as first and second transistors TN11, TN12 for the differential amplifiers DN13, DN14. The source terminals of the second transistors TN11, TN12 of one of the differential amplifiers DN13, DN14 are in each case connected to a common current source IN11, whose other terminal is connected to reference-ground potential GND. The gate terminals of the first transistors TN11 are connected to the respective reference potential VRP3, VRP4 via first input terminals EN11 of the differential amplifiers DN13, DN14 and the input signal VIP is fed to the gate terminals of the second transistors TN12 via second input terminals EN12 of the differential amplifiers DN13, DN14. The drain terminals of the first transistors TN11 form first output terminals AN11 and the drain terminals of the second transistors TN12 form second output terminals AN12 of the differential amplifiers DN13, DN14. The output terminals AN11, AN12 of the differential amplifiers DN13, DN14 are likewise connected to the second supply potential V+ via load resistors RL13, RL23, RL14, RL24. The potentials at the output terminals AN11, AN12 of the differential amplifiers DN13, DN14 having the n-channel transistors are likewise fed to input terminals M3, M4, P3, P4 of comparators (not specifically illustrated) for evaluation of the output potentials.

The advantage of using differential amplifiers DP11, DP12 having p-channel transistors and differential amplifiers DN13, DN14 having n-channel transistors in an A/D converter consists in the possibility of also being able to process input signals VIP which lie below the minimum gate potential for n-channel transistors, as is explained below.

Firstly, the method of operation of a differential amplifier having n-channel transistors in the A/D converter shall be explained using the differential amplifier DN13. In this respect, it should be noted that the load resistors RL11, . . . , RL24 preferably have the same value, this being an assumption on which the following explanation is based.

If the input signal VIP is greater than the third reference potential VRP3, then the second MOS transistor TN12 conducts better than the first MOS transistor TN11 and the current from the second supply source V+ via the load resistor RL23 is greater than the current from the second supply voltage source V+ via the load resistor RL13. The sum of the currents via the load resistors RL13, RL23 is determined by the current supplied by the current source IN11. The voltage U23 across the load resistor RL23 is then greater than the voltage U13 across the load resistor RL13, with the result that the potential at the node P3, or the second output terminal AN12 of the differential amplifier DN13, which results from the difference between the second supply potential V+ and the voltage U23, is less than the potential at the node M3, or the first output terminal AN11 of the differential amplifier DN13, which results from the difference between the second supply potential V+ and the voltage U13. If the input signal VIP falls, then the current through the load resistor RL23 falls and so, too, does the voltage U23, as a result of which the potential at the node P3 rises. When the current through the load resistor RL23 falls, the current through the load resistor RL13 rises, as a result of which the potential at the node M3 falls. The potentials in the nodes M3, P3 have the same magnitude when the input signal VIP corresponds to the third reference potential VRP3, and the potential at the node M3 becomes less than the potential at the node P3 when the input signal VIP falls below the value of the third reference potential VRP3. In order to be able to operate the n-channel transistors in the saturation region, those MOS transistors which are fabricated by means of typical deep submicron processes require gate potentials of at least 0.6 V, of which 0.15 V is allotted to the saturation voltage of the current source IN11, 0.30 V is allotted to the threshold voltage of the transistors TN11, TN12, and 0.15 V is allotted to the effective gate-source voltage of the transistors TN11, TN12.

The method of operation of a differential amplifier having p-channel transistors in the A/D converter is explained using the differential amplifier DP11.

The first supply potential Vdd and the second supply potential V+ are preferably coordinated with one another in such a way that the first supply potential Vdd is greater than the second supply potential V+, with the result that a current can flow from the current source IP11 via the transistors TP11, TP12 and the load resistors RL11, RL21 in the direction of the second supply potential V+. If the input signal VIP is greater than the first reference potential VRP1, then the gate-source voltage of the second transistor TP12 is less than the gate-source voltage of the first transistor TP11, as a result of which a smaller current flows via the second transistor TP12 and the load resistor RL21 than via the first transistor TP11 and the load resistor RL11. The voltage U21 across the load resistor RL21 is thus smaller than the voltage U11 across the load resistor RL11. The potential at the node P1, or the second output terminal AP12 of the differential amplifier DP11, which results from the sum of the voltage U21 and the second supply potential V+, is therefore less than the potential at the node M1, or the first output terminal AP11, of the differential amplifier DP11, which results from the sum of the voltage U21 and the second supply potential V+. If the input signal VIP falls, then the gate-source voltage of the second transistor TP12 rises, as a result of which the current through this transistor TP12 and the load resistor RL21 rises, as a result of which the voltage U21 rises and the potential at the node P1 increases. The currents through the first and second transistors TP11, TP12 have the same magnitude when the input signal VIP corresponds to the first reference potential VRP1. The potential at the node M1 becomes less than the potential at the node P11 when the input signal VIP falls below the value of the first reference potential VRP1.

Both in the case of a differential amplifier DN13 having n-channel transistors and in the case of a differential amplifier having p-channel transistors, the potential at the node P1, P3 is less than the potential at the node M1, M3 if the input signal VIP is greater than the respective reference potential VRP1, VRP3. This potential at the node M1, M3 falls as the input signal VIP falls, as a result of which the potential at the node P1, P3 rises correspondingly. The potentials at the output terminals of differential amplifiers having n-channel transistors and differential amplifiers having p-channel transistors therefore behave correspondingly in the event of changes in the input signal VIP.

The absolute values of the potentials at the output terminals P3, M3 of differential amplifiers DN13 having n-channel transistors and output terminals P1, M1 of differential amplifiers DP11 having p-channel transistors may differ. This is irrelevant to A/D converters, however, since the output signals of the comparators connected downstream, or of other suitable evaluation circuits, such as e.g. convolution stages with a comparator connected downstream, are merely able to differentiate whether the potential at the nodes P1, P3 is greater/less than the potential at the nodes M1, M3. The zero crossings, that is to say the states in which the potentials at the output terminals of a differential amplifier correspond, result in a corresponding manner in the case of differential amplifiers having p-channel transistors and in the case of differential amplifiers having n-channel transistors in each case when the input signal VIP has exactly the same magnitude as the reference potential VRP1; VRP3 assigned to the respective differential amplifier.

In contrast to differential amplifiers having n-channel transistors in which the input signal VIP or the reference potential VRP3 must be at least 0.6 V in order to bring the n-channel transistors into the saturation region, the two differential amplifiers DP11, DP12 having p-channel transistors function even with reference potentials VRP1, VRP2 or an input signal VIP which has to be only slightly greater than 0 V. Therefore, with the A/D converter according to the invention as shown in FIG. 2, it is possible to process considerably smaller input signals VIP than in the case of previously known A/D converters.

Figure 3:
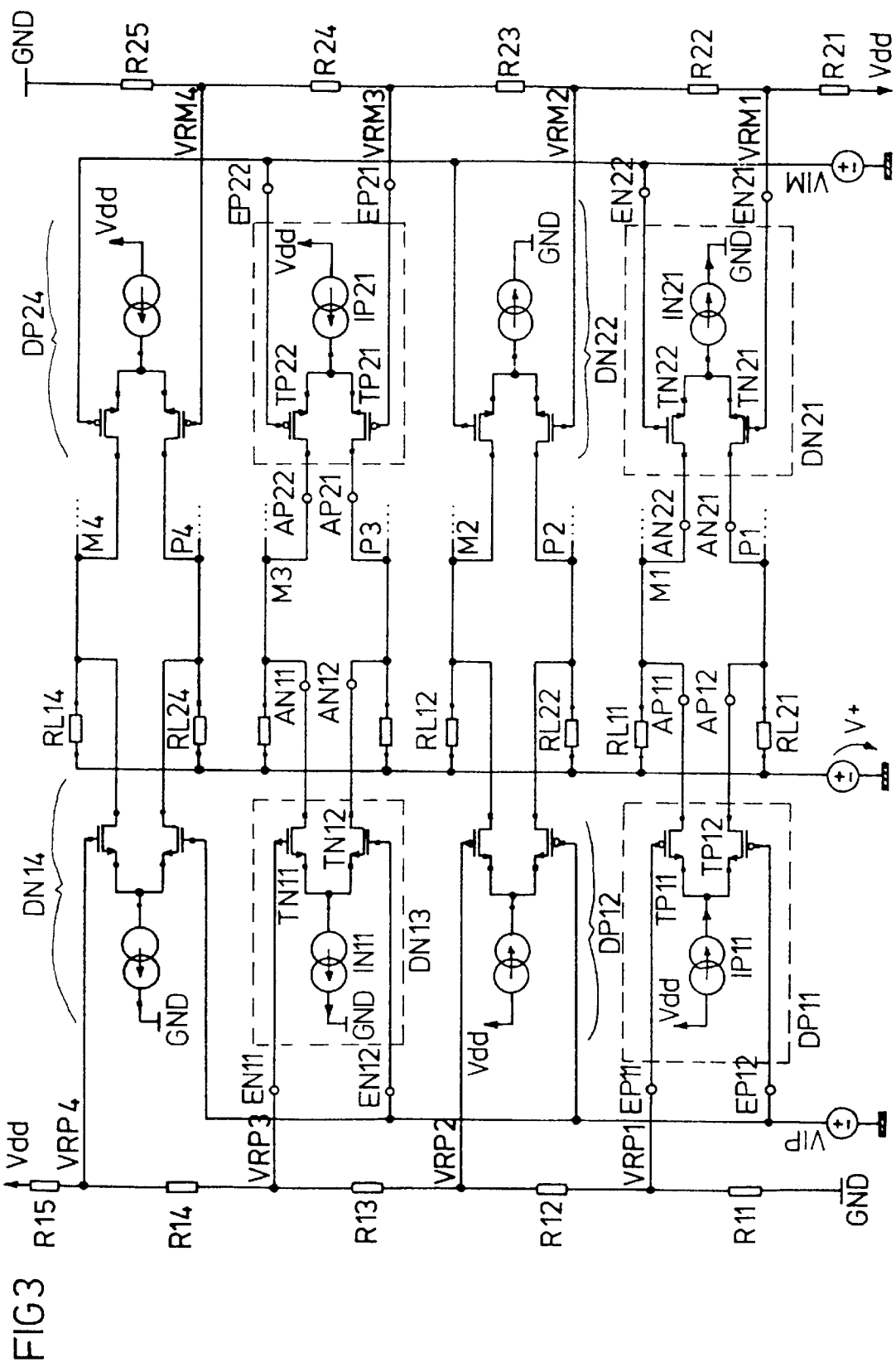
FIG. 3 shows an A/D converter according to the invention in accordance with a second embodiment with a first and a second input stage.

FIG. 3 shows a further exemplary embodiment of an A/D converter according to the invention, in which the A/D converter in accordance with FIG. 2 serves as the first input stage in the left-hand part of the circuit diagram and which has an input stage which is constructed complementarily to the first input stage and is illustrated in the right-hand part of the circuit diagram.

The second input stage has a second reference potential source comprising a series circuit of resistors R21, R22, R23, R24, R25 between the supply potential Vdd and reference-ground potential GND. These resistors R21, ..., R25 preferably have the same value, with the result that reference potentials VRM1, VRM2, VRM3, VRM4, which can be tapped off at nodes between the resistors R21, ..., R25, differ by multiples of the smallest reference potential VRM4. The resistors R11, ..., R15 of the first reference potential source and the resistors R21, ..., R25 of the second reference potential source preferably have the same value. The first reference potential VRP1—drawn off near the reference-ground potential GND—of the first reference potential source then corresponds to the fourth reference potential VRM4—drawn off near the reference-ground potential GND—of the second reference potential source, the reference potential VRP2 corresponds to the reference potential VRM3, the reference potential VRP3 corresponds to the reference potential VRM2, and the reference potential VRP4—drawn off near the supply potential Vdd—of the first reference potential source corresponds to the reference potential VRM1—drawn off near the supply potential Vdd—of the second reference potential source.

The reference potentials VRM1, ..., VRM4 are fed to first input terminals EN21, EP21 of differential amplifiers DN21, DN22, DP23, DP24. A respective second input signal VIM, which preferably results from the difference between the first supply potential Vdd and the first input signal VIP, is fed to second inputs EN22, EP22 of the differential amplifiers DN21, DN22, DP23, DP24. The differential amplifiers DN21, DN22, DP23, DP24 each have a first transistor TN21, TP21 and a second transistor TN22, TP22. For reasons of clarity, only the components of the differential amplifiers DN21 and DP23 are provided with reference symbols in FIG. 2. The differential amplifiers DN21, DN22 connected to the two highest reference potentials VRM1, VRM2 are constructed identically, their transistors TN21, TN22 being designed as n-channel MOS transistors. Equally, the differential amplifiers DP23, DP24, which are connected to the two smallest reference potentials VRM3, VRM4, are of identical design, the first and second transistors TP21, TP22 of these differential amplifiers DP23, DP24 being designed as p-channel MOS transistors.

The method of operation of the differential amplifiers DN21, DN22 corresponds to the method of operation of the differential amplifiers DN13, DN14 and the method of operation of the differential amplifiers having the p-channel transistors DP23, DP24 corresponds to the method of operation of the differential amplifiers DP11, DP12.

The differential amplifier DP11 of the first input stage and the differential amplifier DN21 of the second input stage form a differential amplifier pair, the first output AP11 of the differential amplifier DP11 and a second output AN22 of the differential amplifier DN21 being jointly connected to the node M1, and the second output AP12 of the differential amplifier DP11 and the first output AN21 of the differential amplifier DN21 being jointly connected to the node P1. In a corresponding manner, the differential amplifiers DP12, DN22 form a second differential amplifier pair, the differential amplifiers DN13, DP23 form a third differential amplifier pair, and the differential amplifiers DN14, DP24 form a fourth differential amplifier pair. The first output AN11 of the differential amplifier DN13 is connected with a second output AP22 of the differential amplifier DP23 to the node M3 and the second output AN12 of the differential amplifier DN13 is connected with a first output AP21 of the differential amplifier DP23 to the third node P3. Each of the differential amplifier pairs in the exemplary embodiment in accordance with FIG. 3 thus comprises a differential amplifier having n-channel transistors and a differential amplifier having p-channel transistors.

The differential amplifiers of the first and second input stages act in the same sense on the potential at the respective node to which outputs of differential amplifiers of the first and second input stages are jointly connected, as is explained using the differential amplifier pair DP11, DN21. If the first input signal VIP rises, then, as explained above, the current from the current source IP11 via the second transistor TP12 and the load resistor RL21 falls, as a result of which the potential at the node P1 falls and, in a corresponding manner, the potential at the node M1 rises. If the first input signal VIP rises then the second input signal VIM falls. As a result, the gate-source voltage of the second transistor TN22 falls, as a result of which the current from the second supply voltage V+ via the resistor RL11 and the second transistor TN22 falls and the potential at the node M1 likewise rises. The advantage of using a differential amplifier pair DP11, DN21 whose differential amplifiers are jointly connected to comparators for evaluation of the potentials at the nodes M1, P1, ..., M4, P4 consists in an increase in the common-mode rejection through a fully differential construction, that is to say common-mode interference signals affect the result of the A/D conversion to a lesser extent than in the case of an A/D converter in accordance with FIG. 2.

The current which is caused by the n-channel transistors TN22, TN21, TN11, TN12 through the load resistors RL11, RL21, RL13, RL23 is opposite to the currents which are caused by the p-channel transistors TP11, TP12, TP21, TP22 through said load resistors RL11, RL21, RL13, RL23. However, the changes in the potentials at the nodes M1, P1, M3, P3 which are brought about by changes in the input signals VIP, VIM, or by changes to said currents which are caused thereby, act in the same sense, as has been explained.

Figure 4:
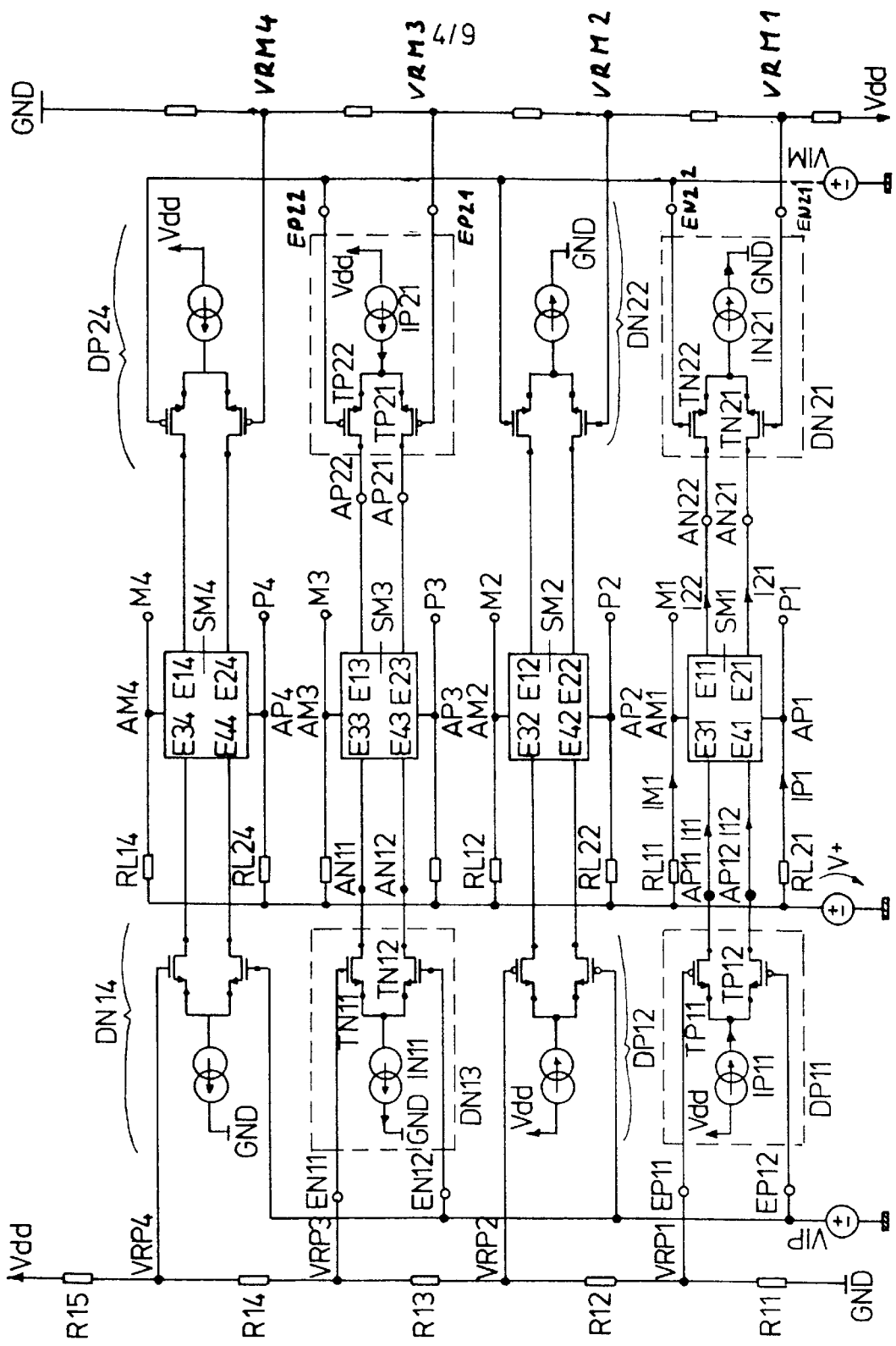
FIG. 4 shows an A/D converter in accordance with a further embodiment, in which output terminals of differential amplifiers of a differential amplifier pair are in each case coupled to one another via a switch for controlling output currents.

In accordance with an embodiment of the A/D converter according to the invention which is illustrated in FIG. 4, it is provided that, in differential amplifier pairs each having a differential amplifier having p-channel transistors and a respective differential amplifier having n-channel transistors, the outputs of these differential amplifiers are connected to the load resistors not directly but via suitable switching means for diverting the output currents.

Accordingly, a first switch SM1 of this type is provided between the differential amplifiers DP11, DN21, a second switch SM2 of this type is provided between the differential amplifiers DP12, DN22, a third switch SM3 of this type is provided between the differential amplifiers DN13, DP23, and a fourth switch SM4 of this type is provided between the differential amplifiers DN14, DP24. Each of the switches SMx (x hereinafter denotes one of the indices 1 to 4) has a first input E1$x$, a second input E2$x$, a third input E3$x$ and a fourth input E4$x$. The connections and method of operation of the identically constructed switches SMx are explained below using the differential amplifier pair DP11, DN21.

The first input E11 of the switch SM1 is connected to the second output AN22 of the differential amplifier DN21 of the second input stage and the second input E21 is connected to the first output AN21 of the differential amplifier DN21 of the second input stage. The third input E31 of the switch SM1 is connected to the first output AP11 and the fourth input E41 is connected to the second output AP12 of the differential amplifier DP11 of the first input stage. The switch SM1 has a first output AM1, which is connected to the load resistor RL11 and to the input M1 of the comparator. The switch SM1 furthermore has a second output AP1, which is connected to the load resistor RL21 and to the input P1 of the comparator.

The switch SM1 is preferably designed in such a way that it brings about a current IM1 via the load resistor RL11 into the switch SM1 for which the following holds true:

IM1=$I_L$+I22−I11, where I11 is the load current of the first p-channel transistor TP11 of the differential amplifier DP11 and I22 is the load current of the second n-channel transistor TN22 of the differential amplifier DN21. The current IL is a constant current brought about by current sources in the switch SM1, and the current IL may also be zero. The switch SM1 furthermore brings about, through the load resistor RL21, a current IP1 into the switch SM1 for which the following holds true:

IP1=$I_L$+I21−I12, where I12 is the load current of the second p-channel transistor TP12 of the differential amplifier DP11 and I21 is the load current of the first n-channel transistor TN21 of the differential amplifier DN21.

The function of the switches SM1, . . . , SM4 is to create more favorable and reproducible operating conditions at the outputs of the differential amplifiers, it being endeavored, in particular, to fix the outputs of the differential amplifiers at a potential near the respective supply potential thereof, in order to ensure that the MOS transistors of the differential amplifiers always remain in saturation in a voltage range around the respective reference potential.

Figure 5:
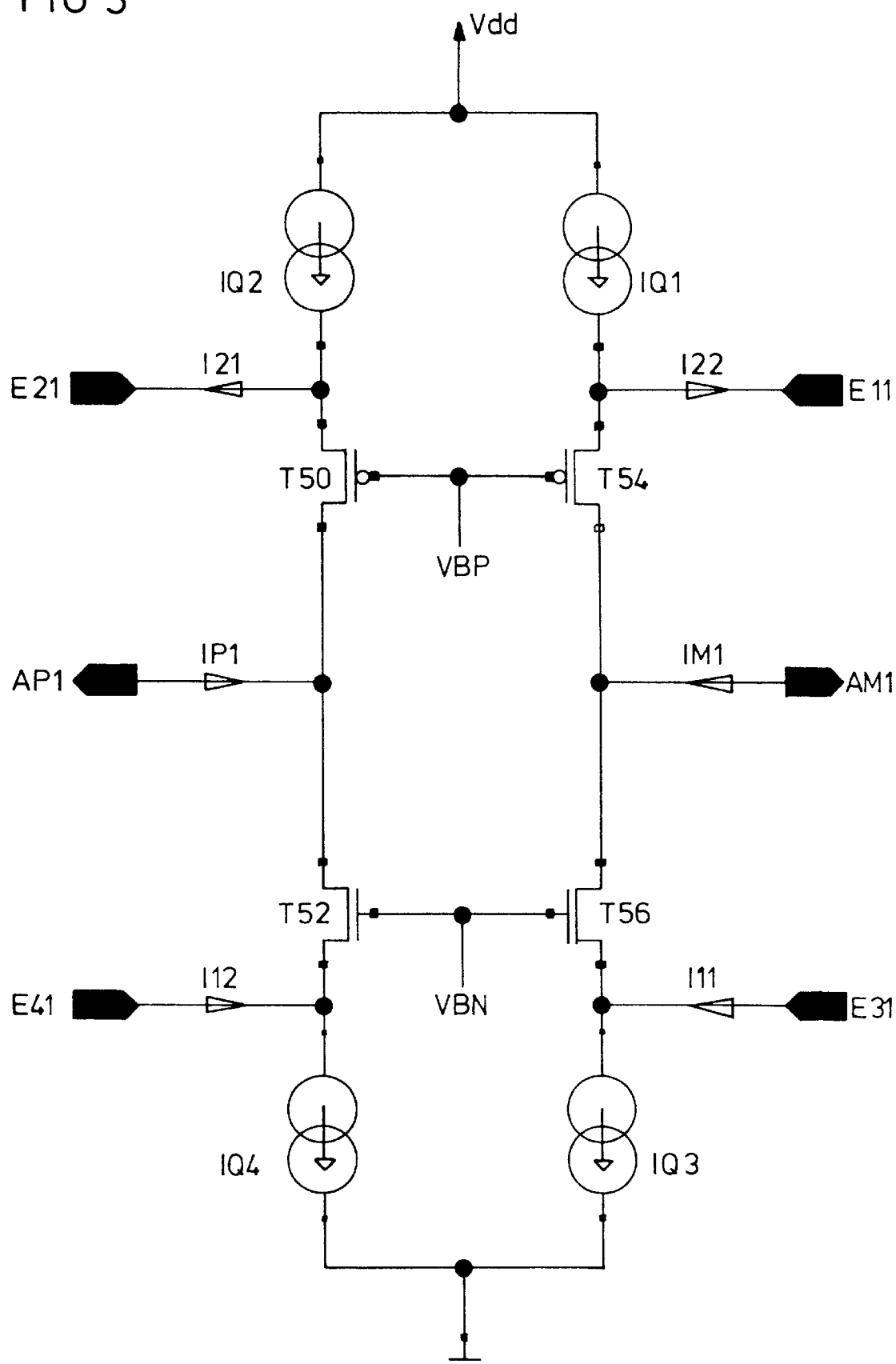
FIG. 5 shows an exemplary embodiment of a switch for controlling the output currents.

The construction of a switch of this type is explained below in FIG. 5, the nomenclature of the input currents and of the connecting terminals corresponding to those of the first switching means SM1 in accordance with FIG. 4.

In order to combine the current I22 at the first input terminal E11 and the current I11 at the third input terminal E31, a series circuit comprising a first current source IQ1, a p-channel transistor T54, an n-channel transistor T56 and a further current source IQ3 is connected up between supply potential Vdd and reference-ground potential GND. In this case, the first input terminal E11 is connected to a node which is common to the current source IQ1 and the transistor T54. The third input terminal E31 is connected to a node which is common to the current source IQ3 and the transistor T56, and the first output terminal AM1 is connected to a node which is common to the transistors T54, T56. In a corresponding manner, in order to combine the currents I21 at the second input terminal E21 and I12 at the fourth input terminal E41, the switch has a series circuit comprising a current source IQ2, a p-channel transistor T50, an n-channel transistor T52 and a further current source IQ4. In this case, the second input terminal E21 is connected between the current source IQ2 and the transistor T50, the fourth input terminal E41 is connected between the transistor T52 and the current source IQ4, and the second output terminal AP1 is connected between the transistors T50 and T52. The gate terminals of the transistors T50, T54 are connected to a common drive potential VBP and the gate terminals of the transistors are connected to a common drive potential VBN. The drive potentials VBP, VBN are chosen suitably here in order to set the operating points of the transistors T50, T52, T54, T56.

Figure 6:
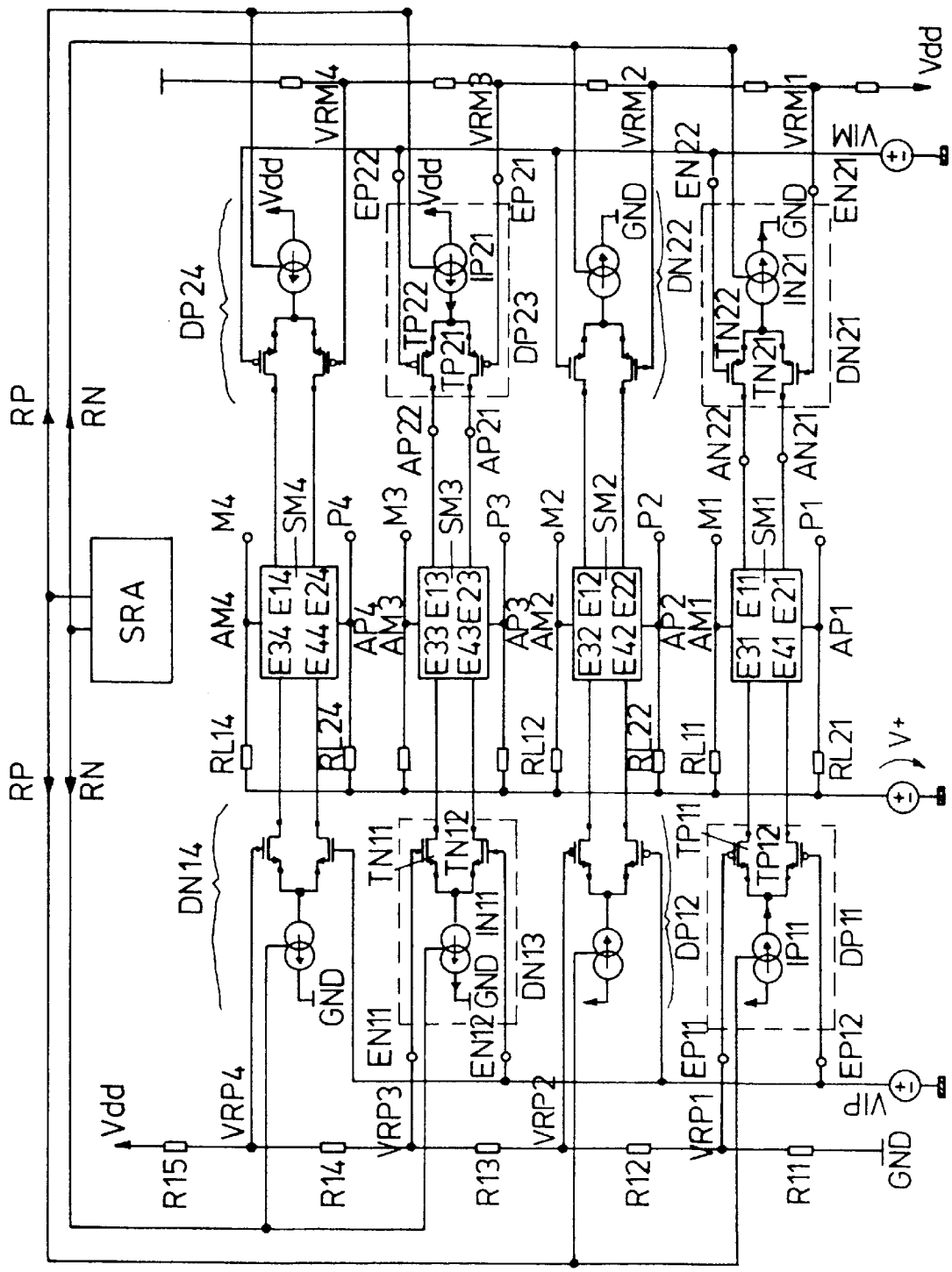
FIG. 6 shows an A/D converter according to the invention in accordance with a further embodiment, in which the current sources of the differential amplifiers are driven by a current regulating arrangement.

Since differential amplifiers having n-channel transistors and differential amplifiers having p-channel transistors usually have different gains, this can adversely affect the suppression of common-mode interference signals respectively superposed on the input signals VIP, VIM in the case of two such differential amplifiers being connected up to form differential amplifier pairs of an A/D converter in accordance with the exemplary embodiments 3 and 4. FIG. 6 shows an exemplary embodiment of an A/D converter according to the invention in which such problems are reduced, in other words the common-mode interference signal suppression is improved. The A/D converter in accordance with FIG. 6 has a current regulating arrangement SRA, which in each case provides a regulating signal RP for driving the current sources in differential amplifiers having p-channel transistors and a regulating signal RN for driving the current sources in differential amplifiers having n-channel transistors.

The current sources IP11, IP21 in the differential amplifiers DP11, DP12, DP23, DP24 to which the drive signal RP is fed are, in the simplest case, p-channel transistors whose load paths are connected up between the supply potential Vdd and the source terminals of the first and second transistors in the respective differential amplifier, the control signal RP being present at the gate terminal of the transistor used as current source. The current sources IN11, IN21 of the differential amplifiers DN13, DN14, DN21, DN22 to which the regulating signal RN is fed are correspondingly designed as n-channel transistors in the simplest case, the regulating signal RN being fed to the gate terminals of said transistors.

By means of the control signals RN, RP, the current regulating arrangement SRA controls the current flow of the current sources in such a way that the transconductance of the differential amplifier transistors connected to a current source is in each case proportional to the reciprocal of a constant resistance. The driving of the current source by means of the current regulating arrangement SRA means that both the p-channel transistors and n-channel transistors have the same transconductance, with the result that the differential amplifiers of a differential amplifier pair have the same gain in each case.

Figure 7:
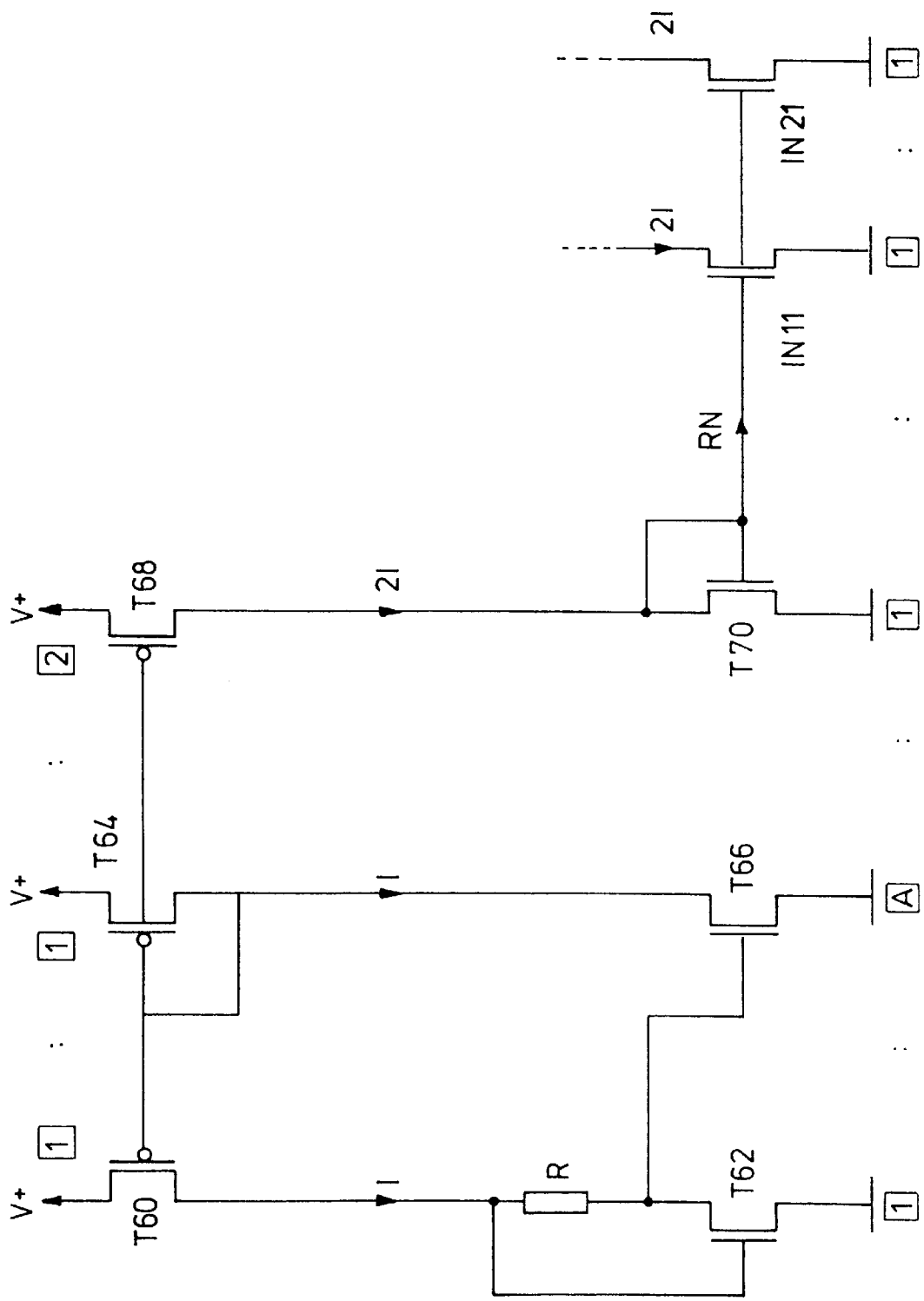
FIG. 7 shows a circuit diagram of part of the current regulating arrangement in accordance with FIG. 6.

A current regulating arrangement SRA of this type belongs to the prior art and is described for example in Wai-Kai Chen: "The circuit and filters handbook", CRC press 1995, FIG. 57.56, page 1686. FIG. 7 shows an exemplary embodiment of a further current regulating arrangement SRA for providing the regulating signal RN for the current sources IN21, IN11 comprising n-channel transistors. This current regulating arrangement SRA has two n-channel transistors T62, T66, whose source terminals are connected to reference-ground potential GND. The gate terminal of the transistor T66 is connected to the drain terminal of the transistor T62 and the gate terminal of the transistor T62 is connected to its drain terminal via a resistor R. A current mirror comprising p-channel transistors T60, T64, whose source terminals are connected to a supply potential V+ and which have a current ratio of 1:1, brings about identical currents I through the transistors T62, T66. The current ratio of the transistors T62 and T66 is 1:A in this case.

A further p-channel current mirror transistor T68, whose current ratio to the transistors T60, T64 is 2:1, is connected in series with an n-channel transistor T70. The source terminal thereof is connected to reference-ground potential GND and the gate terminal thereof is connected to its drain terminal. The gate potential of this transistor T70 serves as drive signal RN, that is to say as gate potential for the MOS transistors which are used as current sources and of which the current sources IN11, IN21 are illustrated by way of example in FIG. 7.

A current regulating arrangement for driving the current sources of the differential amplifiers having p-channel transistors can be produced in a corresponding manner from the current regulating arrangement in accordance with FIG. 7 if the p-channel transistors are replaced by n-channel transistors, and vice versa, and if the connecting terminals for the supply potentials are interchanged.

Ideally, the current sources of the differential amplifiers are driven in a manner dependent on the respective reference potential to which the differential amplifier is connected. This is indicated in FIG. 8 by the fact that the current sources are connected to the respective reference potential.

By virtue of the driving of the current sources in a manner dependent on the reference potential, the gain of the differential amplifiers of a differential amplifier pair can be regulated more accurately than in the embodiment in accordance with FIG. 7, in order thus to attain a gain of the differential amplifiers which comes nearer to a predetermined desired value than in the embodiment in accordance with FIG. 7. For a circuitry realization of a regulating arrangement, it suffices, in the regulating loop which is disclosed in the abovementioned publication and sets the transconductance of a MOS transistor proportionally to the reciprocal of a resistance, to operate the respective MOS transistor at source and drain voltages which the MOS transistors of the differential amplifier whose current source is intended to be regulated have in the state of equilibrium. Such a state is established when the respective reference potential is fed to the gate of the MOS transistor which is regulated by the current regulating arrangement and is used as current source.

Figure 8:
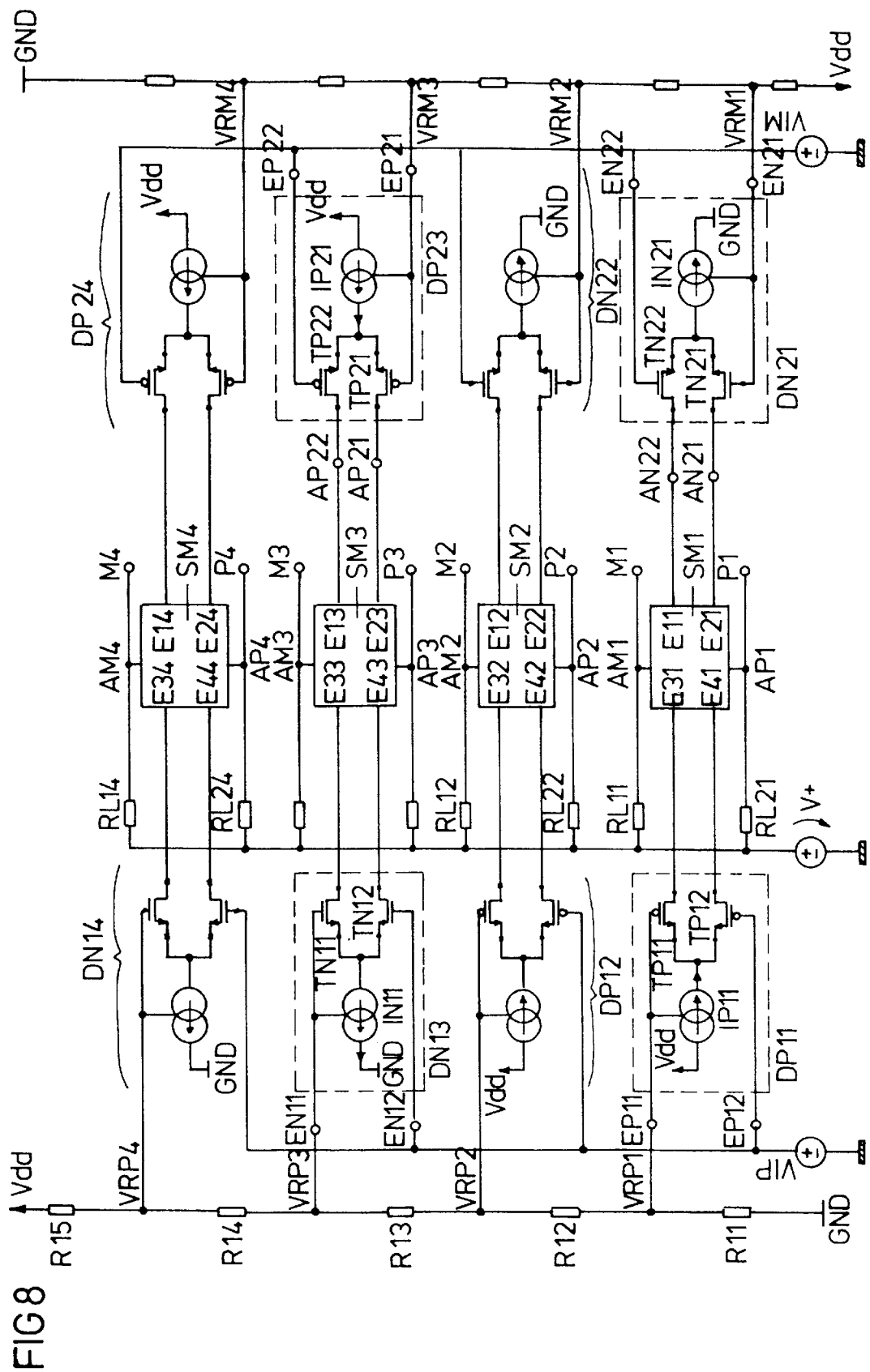
FIG. 8 shows an A/D converter according to the invention in accordance with a further embodiment, in which the current sources are driven in a manner dependent on the respective reference potentials.
Figure 9:
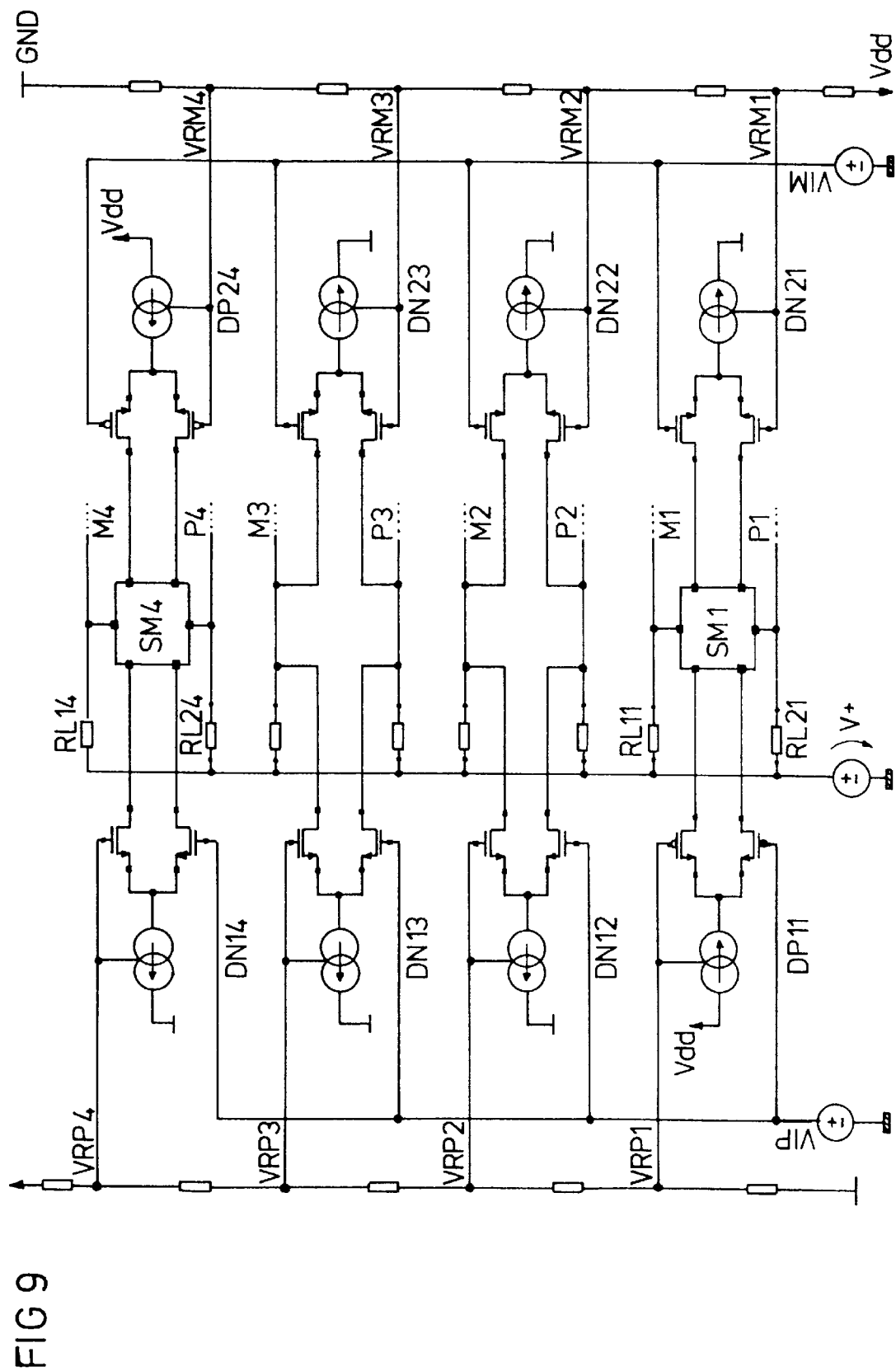
FIG. 9 shows an A/D converter in accordance with a further embodiment of the invention.

Differential amplifier pairs each having a differential amplifier having n-channel transistors and a differential amplifier having p-channel transistors are always represented in the exemplary embodiments in accordance with FIGS. 3, 4 and 8, which each show A/D converters having two input stages. FIG. 9 shows a further exemplary embodiment of an A/D converter according to the invention, in which differential amplifier pairs having complementary differential amplifiers DP11, DN21, DN14, DP24 are used only for processing the lowest reference potentials VRP1, VRM4 and the highest reference potentials VRP4, VRM1. The remaining differential amplifier pairs each comprise two differential amplifiers DN13, DN23, DN12, DN22 having two n-channel transistors in each case. Switches SM1, SM4 for diverting the output currents of the complementary differential amplifiers, as were explained with reference to FIGS. 4 and 5, are accordingly provided only in the case of differential amplifier pairs having complementary differential amplifiers. In the differential amplifier pairs having two differential amplifiers comprising n-channel transistors, it is respectively the case that, as known from the prior art, outputs of the differential amplifier of the first input stage and outputs of the differential amplifier of the second input stage are connected to one another and to load terminals.

Although the A/D converter according to the invention has been explained using a 4-bit converter, the invention is not, of course, restricted thereto. The A/D converter shown in the figures can have virtually any desired number of differential amplifiers or differential amplifier pairs which are connected up in the manner shown in the figures. In the case of high-resolution A/D converters, the further circuit of the A/D converter for evaluation of the potentials at the output terminals of the differential amplifiers can also comprise so-called convolution stages of a convolution A/D converter, downstream of which comparators are again connected.

In order to improve the output conductance, it is possible to insert further transistors as cascodes in the circuit paths beginning at the drain terminal of the transistors.

It goes without saying that the present invention is not restricted to the use of MOS transistors. The differential amplifiers can equally be realized for example by means of NPN bipolar transistors instead of the n-channel MOS transistors and by means of PNP bipolar transistors instead of the p-channel MOS transistors.

List of Reference Symbols
A11, A21 First output terminals of the differential amplifiers
A12, A22 Second output terminals of the differential amplifiers
AMx, APx Output terminals of the switching means
AN11, AN21 First output terminals
AN12, AN22 Second output terminals
AP11, AP21 First output terminals
AP12, AP22 Second output terminals
DN21, DN22, DN13, DN14 Differential amplifiers having n channel transistors
DP11, DP12, DP23, DP24 Differential amplifiers having p-channel transistors
DV11, DV12, DV13, DV14 Differential amplifiers of the first input stage
DV21, DV22, DV23, DV24 Differential amplifiers of the second input stage
E1$x$, E2$x$, E3$x$, E4$x$ Input terminals of the switching means
EN11, EN21 First input terminals
EN12, EN22 Second input terminals
EP11, EP21 First input terminals
EP12, EP22 Second input terminals
GND Reference-ground potential
IN11, IN21 Current sources
IP11, IP21 Current sources
IQ1, IQ2, IQ3, IQ4 Current sources
M1, M2, M3, M4 Second input terminals of a comparator
P1, P2, P3, P4 First input terminals of a comparator
R Resistor
R11, R12, R13, R14, R15 Resistors
R21, R22, R23, R24, R25 Resistors
RL1, RL2 Load resistors
RL11, RL22, RL12, RL22,
RL13, RL23, RL14, RL24 Load resistors
RN Second regulating signal
RP First regulating signal
SM1, SM2, SM3, SM4 Switching means
SRA Current regulating arrangement
T11, T21 First transistors
T12, T22 Second transistors
T50, T54 p-channel transistors
T52, T56 n-channel transistors
T60, T64, T68 p-channel transistors
T62, T66, T70 n-channel transistors
TN11, TN21 First n-channel transistors
TN12, TN22 Second n-channel transistors
TP11, TP21 First p-channel transistors
TP12, TP22 Second p-channel transistors
V+ Second supply potential
Vdd First supply potential
VIP First input signal VRM1, VRM2, VRM3, VRM4 Reference potentials
VRP1, VRP2, VRP3, VRP4 Reference potentials

What is claimed is:

1. An analog-to-digital converter, comprising:

a first reference potential source for providing first reference potentials;

a first input stage having at least two differential amplifiers, each of said differential amplifiers having a first and second transistor, a first input for feeding in one of the reference potentials, a second input for feeding in a first input signal, and two output terminals;

said first and second transistors of a first of said differential amplifiers complementing said first and second transistors of a second of said differential amplifiers;

a differential amplifier pair formed by one of said differential amplifiers of said first input stage and one of said differential amplifiers of said second input stage, said transistors of said differential amplifier pair having outputs complementing each other and coupled to one another;

a switch coupling said outputs of said differential amplifiers of said differential amplifier pair to combine the output currents available at said outputs;

said switch having a first input terminal for connection to said second output terminal of said differential amplifier of said second input stage, a second input terminal for connecting to said first output terminal of said differential amplifier of said second input stage, a third input terminal for connection to said first output terminal of said differential amplifier of said first input stage, a fourth input terminal for connection to said second output terminal of said differential amplifier of said first input stage, a first output terminal for providing a first output signal, and a second output terminal for providing a second output signal;

said current at said first output terminal equaling:

$$IM1 = IL + I22 - I11,$$

where IM1 is the current at said first output terminal, IL is a constant current, I22 is the current at said first input terminal, and I11 is the current at said third input terminal; and the current at said second output terminal equals:

$$IP1 = IL + I21 - I12,$$

where IP1 is the current at said second output terminal, I21 is the current at said second input terminal, and I12 is the current at said fourth input terminal.

2. An analog-to-digital converter, comprising:

a first reference potential source for providing first reference potentials;

a first input stage having at least two differential amplifiers, each of said differential amplifiers having a current source, a first and second transistor, a first input for feeding in one of the reference potentials, a second input for feeding in a first input signal, and two output terminals;

said first and second transistors of a first of said differential amplifiers complementing said first and second transistors of a second of said differential amplifiers; and a current regulating circuit for driving said current sources of said differential amplifier pair.

3. The analog-to-digital converter according to claim 2, wherein said regulating circuit drives said current sources to proportion transconductances of said transistors connected to respective current sources to a reciprocal of a predeterminable resistance when said differential stages are in equilibrium.

4. The analog-to-digital converter according to claim 3, wherein said current source of each of said differential amplifiers is regulated to depend on the reference potential fed to said differential amplifier.

5. An analog-to-digital converter, comprising:

a first reference potential source for providing first reference potentials;

a first input stage having at least two differential amplifiers, each of said differential amplifiers having a first and second transistor, a first input for feeding in one of the reference potentials, a second input for feeding in a first input signal, and two output terminals;

said first and second transistors of a first of said differential amplifiers complementing said first and second transistors of a second of said differential amplifiers;

said differential amplifiers having p-channel transistors connected to the reference potential of said reference potential sources having a smallest magnitude.

6. An analog-to-digital converter, comprising:

a first reference potential source for providing first reference potentials;

a first input stage having at least two differential amplifiers, each of said differential amplifiers having a first and second transistor, a first input for feeding in one of the reference potentials, a second input for feeding in a first input signal, and two output terminals;

said first and second transistors of a first of said differential amplifiers complementing said first and second transistors of a second of said differential amplifiers;

said first input stage having a differential amplifier with p-channel transistors and a first input connected to a smallest reference potential of said first reference potential source.

7. An analog-to-digital converter, comprising:

a first reference potential source for providing first reference potentials;

a first input stage having at least two differential amplifiers, each of said differential amplifiers having a first and second transistor, a first input for feeding in one of the reference potentials, a second input for feeding in a first input signal, and two output terminals;

said first and second transistors of a first of said differential amplifiers complementing said first and second transistors of a second of said differential amplifiers;

said second input stage having a differential amplifier with p-channel transistors, said p-channel transistors each having a first input connected to a smallest reference potential of said second reference potential source.

8. An analog-to-digital converter, comprising:

a first reference potential source for providing first reference potentials;

a first input stage having two differential amplifiers, each of said differential amplifiers having a first and second transistor, a first input for receiving one of said reference potentials, a second input for receiving a first input signal, and two output terminals;

said first and second transistors of a first of said differential amplifiers complementing said first and second transistors of the other of said differential amplifiers.

9. The analog-to-digital converter according to claim 8, wherein said first and second transistors of the first of said differential amplifiers are p-channel MOS transistors, and said first and second transistors of the other of said differential amplifiers are n-channel transistors.

10. The analog-to-digital converter according to claim 8, including:
   a second reference potential source for providing second reference potentials; and
   a second input stage having two differential amplifiers, each having a first and second transistor, a first input for receiving one of the second reference potentials, a second input for receiving a second input signal, and two output terminals.

11. The analog-to-digital converter according to claim 10, wherein said first and second transistors of a first of said differential amplifiers of said second input stage complement said transistors of the other of said differential amplifiers of said second input stage.

12. The analog-to-digital converter according to claim 8, including:
   a control terminal of said first transistor of said first differential amplifier of said first input stage being connected to said first input for receiving one of said reference potentials of said first amplifier;
   a control input of said second transistor of said first differential amplifier of said first input stage being connected to said second input for receiving the first input signal.

13. The analog-to-digital converter according to claim 12, including:
   first load terminals of said first and second transistors being connected to a common current source;
   a respective first output terminal of each of said amplifiers;
   a respective second output terminal of each of said amplifiers;
   second load terminals of said first transistor being connected to said first output terminal of said respective differential amplifier; and
   a second load terminal of said second transistor being connected to said second output terminal of said respective differential amplifier.

14. The analog-to-digital converter according to claim 13, wherein each of said first and second output terminals of said differential amplifier of said first input stage are coupled to a supply potential.

15. The analog-to-digital converter according to claim 8, including:
   a second input stage;
   a differential amplifier of said second input stage;
   a first transistor of said differential amplifier of said second input stage;
   a second transistor of said differential amplifier of said second input stage;
   a first input of said second input stage for receiving a reference potential;
   a control input of said first transistor of said differential amplifier being connected to said first input;
   a control input of said second transistor of said differential amplifier of said second input stage; and
   a second input of said second input stage for receiving a second input signal, said second input being connected to said control input of said second transistor of said differential amplifier of said second input stage.

16. The analog-to-digital converter according to claim 15, including:
   a first output terminal of said differential amplifier;
   a second output terminal of said differential amplifier;
   a first load terminal of said first transistor of said differential amplifier of said second stage being connected to a common current source;
   a first load terminal of said second transistor of said differential amplifier of said second stage being connected to the common current source;
   a second load terminal of said first transistor being connected to said first output terminal of said differential amplifier; and
   a second load terminal of said second transistor being connected to said second output terminal of said differential amplifier.

17. The analog-to-digital converter according to claim 16, wherein said first and second output terminals of said differential amplifier of said second input stage are coupled to a supply potential.

18. The analog-to-digital converter according to claim 8, including:
   a second input stage;
   a differential amplifier of said second input stage;
   a first output of said differential amplifier of said second input stage;
   a second output of said differential amplifier of said second input stage; and
   each of said first outputs of said differential amplifiers of said first input stage being coupled to said second output of said differential amplifier of said second input stage; and
   a second output of said differential amplifier of said first input stage being coupled to said first output of said differential amplifier of said second input stage.

19. The analog-to-digital converter according to claim 18, wherein said transistors of a differential amplifier pair including a differential amplifier of the first input stage and a differential amplifier of the second input stage having outputs being coupled to one another and complementing each other.

20. The analog-to-digital converter according to claim 19, including a switch coupling said outputs of said differential amplifiers of said differential amplifier pair to one another to output currents available at said outputs.

21. The analog-to-digital converter as claimed in claim 20, including:
   a first input terminal of said switch connecting to said second output terminal of said differential amplifier of said second input stage;
   a second input terminal of said switch connecting to said first output terminal of said differential amplifier of said second input stage;
   a third input terminal of said switch connecting to said first output terminal of said differential amplifier of said first input stage;
   a fourth input terminal of said switch connecting to said second output terminal of said differential amplifier of said first input stage;
   a first output terminal of said switch for providing a first output signal; and
   a second output terminal of said switch for providing a second output signal.

22. The analog-to-digital converter as claimed in claim 21, wherein:

the first output signal at said first output terminal equals:

$$IM1 = IL + I22 - I11;$$

IM1 is the current at said first output terminal of said switch;

IL is a constant current;

I22 is the current at said first input terminal of said switch;

I11 is the current at said third input terminal of said switch;

the current at said second output terminal equals:

$$IP1 = IL + I21 - I12;$$

IP1 is the current at said second output terminal of said switch;

I21 is the current at said second input terminal of said switch; and

I12 is the current at said fourth input terminal of said switch.

23. The analog-to-digital converter according to claim 18, including:

p-channel transistors in said differential amplifier of said second input stage;

a respective first input of each of said p-channel transistors being connected to the smallest reference potential of said second reference potential sources.

24. The analog-to-digital converter according to claim 8, including a current regulating circuit driving said current sources of a differential amplifier pair having differential amplifiers with complementary transistors.

25. The analog-to-digital converter according to claim 24, wherein said regulating circuit drives said current sources and proportions a transconductance of said transistors connected to said respective current source to a reciprocal of a predeterminable resistance equilibrating said differential stages.

26. The analog-to-digital converter according to claim 25, wherein a magnitude of said current source of at least one of said differential amplifiers depends on the reference potential fed to said differential amplifier.

27. The analog-to-digital converter according to claim 8, including p-channel transistors in each of said differential amplifiers being connected to the reference potential of said reference potential sources having the smallest magnitude.

28. The analog-to-digital converter according to claim 8, including, in said first input stage, a differential amplifier with p-channel transistors, each of said p-channel transistor having a first input being connected to the smallest reference potential of said first reference potential sources.

* * * * *